(12) United States Patent
Hooshyar

(10) Patent No.: US 12,565,119 B2
(45) Date of Patent: Mar. 3, 2026

(54) METHOD FOR MONITORING AGEING OF A BATTERY UNIT

(71) Applicant: VOLVO TRUCK CORPORATION, Gothenburg (SE)

(72) Inventor: Hamed Hooshyar, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 695 days.

(21) Appl. No.: 17/996,877

(22) PCT Filed: Apr. 23, 2020

(86) PCT No.: PCT/EP2020/061263
§ 371 (c)(1),
(2) Date: Oct. 21, 2022

(87) PCT Pub. No.: WO2021/213654
PCT Pub. Date: Oct. 28, 2021

(65) Prior Publication Data
US 2023/0150396 A1 May 18, 2023

(51) Int. Cl.
*B60L 58/16* (2019.01)
*G01R 31/392* (2019.01)
*H02J 7/00* (2006.01)

(52) U.S. Cl.
CPC ............ *B60L 58/16* (2019.02); *G01R 31/392* (2019.01); *H02J 7/005* (2020.01)

(58) Field of Classification Search
CPC ........ B60L 58/16; B60L 3/0046; B60L 50/60; G01R 31/392; H02J 7/005; H02J 7/0048; Y02T 10/70
See application file for complete search history.

(56) References Cited

U.S. PATENT DOCUMENTS 8,035,395 B2 * 10/2011 Suzuki ................. G01R 31/392
320/132
9,878,631 B2 * 1/2018 Hyde ........................ B60L 1/14
(Continued)

FOREIGN PATENT DOCUMENTS

CN 102749589 A 10/2012
CN 105301510 A 2/2016
(Continued)

OTHER PUBLICATIONS

International Search Report and Written Opinion in corresponding International Application No. PCT/EP2020/061263 mailed Jan. 20, 2021 (10 pages).
(Continued)

*Primary Examiner* — Jared Fureman
(74) *Attorney, Agent, or Firm* — Jeffri A. Kaminski; Venable LLP

(57) ABSTRACT

A method for monitoring battery ageing of a battery unit in an energy storage system of a vehicle or vessel. The method includes predicting an expected service life of the battery unit based on at least information relating to a planned usage of the battery unit, during usage of the battery unit, obtaining operational data relating to an actual usage of the battery unit, predicting an actual service life of the battery unit based on at least the obtained operational data, comparing the predicted actual service life with the predicted expected service life, thus obtaining a comparison result; determining whether a predetermined notification criterion is fulfilled
(Continued)

based on the comparison result, generating a notification to a user of the battery unit at least if the predetermined notification criterion is fulfilled.

13 Claims, 2 Drawing Sheets

(56)                    References Cited

U.S. PATENT DOCUMENTS

| | | | | |
|---|---|---|---|---|
| 9,895,991 | B2 * | 2/2018 | Kim | B60L 58/12 |
| 10,488,467 | B2 * | 11/2019 | Lee | G01R 31/3646 |
| 11,226,374 | B2 * | 1/2022 | Severson | G01R 31/3648 |
| 11,346,891 | B2 * | 5/2022 | Gorrachategui | G01R 31/392 |
| 11,408,942 | B2 * | 8/2022 | Liu | G01R 31/367 |
| 11,809,255 | B2 * | 11/2023 | Hooshyar | G01R 31/36 |
| 12,187,138 | B2 * | 1/2025 | Altaf | G01R 31/367 |
| 12,252,021 | B2 * | 3/2025 | Altaf | G01R 31/389 |
| 12,320,854 | B2 * | 6/2025 | Altaf | B60L 3/12 |
| 2008/0186028 | A1 | 8/2008 | Jones et al. | |
| 2009/0205890 | A1 | 8/2009 | Diegelmann et al. | |
| 2015/0239365 | A1 | 8/2015 | Hyde et al. | |
| 2016/0221465 | A1 | 8/2016 | Kratzer et al. | |
| 2020/0020178 | A1 * | 1/2020 | Fröhner | G07C 3/00 |

FOREIGN PATENT DOCUMENTS

| | | | | | |
|---|---|---|---|---|---|
| CN | 106772100 | A | * | 5/2017 | G01R 31/367 |
| CN | 105301510 | B | * | 9/2017 | |
| CN | 111044927 | A | | 4/2020 | |
| JP | 2004191152 | A | * | 7/2004 | |
| JP | 3792874 | B2 | * | 7/2006 | G01R 31/3842 |
| JP | 2018179733 | A | * | 11/2018 | H01M 10/48 |
| SE | 541804 | C2 | * | 12/2019 | G01R 31/367 |
| WO | 2016112926 | A1 | | 7/2016 | |
| WO | 2019199219 | A1 | | 10/2019 | |

OTHER PUBLICATIONS

International Preliminary Report on Patentability in corresponding International Application No. PCT/EP2020/061263 mailed Apr. 13, 2022 (7 pages).
Chinese Office Action dated Jan. 24, 2025 in corresponding Chinese Patent Application No. 202080099991.7, 16 pages.

* cited by examiner 201
202
208
204
200

| Predicting expected service life | — S1 |
| Obtaining operational data | — S2 |
| Predicting actual service life | — S3 |
| Comparing service lives | — S4 |
| Notification criteria fulfilled? | — S5 |
| Generating notification to user | — S6 |
| Determining reason for deviation | — S7 |
| Providing information to user | — S8 |

METHOD FOR MONITORING AGEING OF A BATTERY UNIT

CROSS-REFERENCE TO RELATED APPLICATIONS

This application is a U.S. National Stage application of PCT/EP2020/061263, filed Apr. 23, 2020 and published on Oct. 28, 2021, as WO 2021/213654, all of which is hereby incorporated by reference in its entirety.

TECHNICAL FIELD

The invention relates to a method for monitoring battery ageing of a battery unit in an energy storage system of a vehicle. The invention further relates to a computer program, a computer readable medium, a control unit, a battery management system, and a vehicle.

The invention can be applied in any type of hybrid vehicles or electrical vehicles, such as partly or fully electrical vehicles. Although the invention will be described with respect to an electrical bus, the invention is not restricted to this particular vehicle, but may also be used in other hybrid or electrical vehicles such as electrical trucks, electrical construction equipment, and electrical cars, and it may also be used in electrical vessels. The invention may also be applied in any other type of electrical vehicle such as electrically powered construction equipment, electrical working machines, e.g. wheel loaders, articulated haulers, dump trucks, excavators and backhoe loaders etc.

BACKGROUND

Batteries are becoming a more common source of power for providing propulsion for vehicles. Such batteries are often rechargeable batteries and typically include a number of battery cells that may be connected in series or in parallel forming a complete battery pack for the vehicle. The vehicle may be provided with several such battery packs, depending on the requirements of a user of the vehicle. Generally, the number of battery packs and the size of the battery packs with which the vehicle is to be provided are determined based on a planned usage of the vehicle. For example, when purchasing an electrical bus, the user may specify that the battery packs should be functional for a certain time, such as a number of years. The user may further specify that the planned usage of the bus is in city traffic, which is associated with certain operating conditions in terms of, for example, charge and discharge cycles of the battery packs. Based on the information provided by the user, the bus is equipped with a suitable set of battery packs.

However, in many cases the actual usage of the vehicle may differ from the planned usage. Because of this, the lifetime of the battery packs may be affected. For example, if the usage is harsher than planned, the lifetime decreases and the performance of the battery packs will over time deteriorate more than the user expects.

US2016/0221465 discloses a method for monitoring state of health (SoH) of an energy storage system (ESS), wherein permissible operating parameter ranges of the ESS are adjusted if a comparison between an actual SoH and a desired SoH demonstrates an increased rate of ageing in comparison to the desired SoH. The ESS is thus forced to operate at adjusted operating parameter ranges if its actual SoH differs from the desired SoH.

SUMMARY

A primary object of the invention is to provide an in at least some aspect improved method for monitoring battery ageing of a battery unit in an energy storage system of a vehicle or a vessel. In particular, it is an object to provide a method that enables a user of the vehicle to take an informed decision on how to operate the vehicle or vessel to attain a desired service life of the battery unit.

At least the primary object is at least partly achieved by a method according to claim 1. According to a first aspect of the invention, a method for monitoring battery ageing of a battery unit in an energy storage system of a vehicle or a vessel is provided, the method comprising:

predicting an expected service life of the battery unit based on at least information relating to a planned usage of the battery unit, during usage of the battery unit, obtaining operational data relating to an actual usage of the battery unit, predicting an actual service life of the battery unit based on at least the obtained operational data, comparing the predicted actual service life with the predicted expected service life, thus obtaining a comparison result;

determining whether a predetermined notification criterion is fulfilled based on the comparison result, generating a notification to a user of the battery unit if the predetermined notification criterion is fulfilled.

By comparing a predicted actual service life, predicted based on operational data of the vehicle, and a predicted expected service life, predicted based on information relating to the planned usage, it may be determined whether the actual service life will deviate from the expected service life. The generated notification, generated if the notification criterion is fulfilled, may be sent to the user such that the user may decide on a suitable action in view of the notification. Several different notification criteria may be defined, leading to generation of notifications with different information contents. A notification criterion may for example be defined such that it is considered fulfilled when the comparison result reveals that the predicted service life does not meet the expected service life, wherein the generated notification contains information relating to this. Another notification criterion may be defined so that it is considered fulfilled when the comparison result reveals that the predicted service life meets the expected service life. This may be important information to the user, in particular if earlier comparisons have indicated a deviation.

The information relating to the planned usage of the battery unit may for example be information relating to use cycles of the battery unit, such as charge and discharge cycles. The information may further relate to planned state of charge (SOC) window, temperature, charge rate and capacity throughput.

The operational data may be data obtained from various sensors and measurement devices of the energy storage system (ESS), or it may be operational data calculated based on such data. The operational data may for example include data relating to battery temperature, depth of discharge (DoD), state of charge (SoC), charging rate, and charging pattern.

By the service life of the battery unit is herein intended the service life in the first application of the battery unit, i.e. a time period from the beginning of the service life, the battery unit having 100% of its original capacity, to an end of the service life in the first application, the battery unit having a predefined amount or ratio left of its original capacity, such as e.g. 80%, 70% or 60% of the original capacity, depending on the application.

Optionally, predicting the expected service life of the battery unit comprises:

creating a set of battery usage classifications, wherein each battery usage classification is associated with at least one set of predefined operating parameter ranges, for each battery usage classification, determining at least one expected ageing curve associated with each battery usage classification, classifying the planned usage of the battery unit in accordance with the set of battery usage classifications, wherein the prediction of the expected service life is determined based on the at least one expected ageing curve of the battery usage classification associated with the classified planned usage.

The classification into different usage classifications, or usage categories, may be used to illustrate to the user of the vehicle how the usage of the battery unit affects its service life. The classification may thereby facilitate communication with the user. As the ageing of the battery unit is dependent on several detailed technical parameters, these classifications simplifies the ageing behaviour and help end users to understand it easier. Optionally, each battery usage classification may be associated with a single expected ageing curve, or with a set of ageing curves represented by a single expected ageing curve. The battery usage classifications may be set so that differences in expected service life between the classifications are significant.

Optionally, determining the at least one expected ageing curve comprises simulating ageing of the battery unit for operating parameter values within the at least one set of predefined operating parameter ranges. Ageing is thus simulated based on information relating to the planned usage, wherein the planned usage implies operating parameter values within certain operating parameter ranges.

Optionally, the simulation of ageing is performed based on battery cell operational data obtained in battery cell tests, wherein the battery cell tests are carried out for at least one type of battery cell comprised in the battery unit. The battery cell tests may be laboratory battery cell tests. The battery unit may comprise different types of battery cells, in which case battery cell tests for at least some of the different types of cells may be carried out. The battery cell tests may be carried out at least for the battery cell type(s) expected to have a major influence on the ageing behaviour of the battery unit. Commonly, the battery unit comprises battery cells of a single chemistry type, although the proposed method would be possible to use also for battery units comprising battery cells of different chemistry types.

Optionally, predicting the actual service life of the battery unit comprises classifying the actual usage of the battery unit in accordance with the set of battery usage classifications. The classification of the actual usage may be continuously updated during the service life of the battery unit. The classification of the actual usage facilitates communication regarding the predicted service life with the user of the vehicle, since it illustrates why, for example, the actual service life deviates from the predicted service life in a particular case. The classification of the actual usage may be carried out by comparing the operational data relating to the actual usage of the battery unit with the at least one set of predefined operating parameter ranges associated with the battery usage classifications.

Optionally, the predicted actual service life of the battery unit is determined based on the at least one expected ageing curve of the battery usage classification associated with the classified actual usage. This is a computationally efficient and straightforward way of determining the predicted actual service life.

Optionally, the predetermined notification criterion is considered fulfilled if the battery usage classification associated with the classified actual usage differs from the battery usage classification associated with the classified planned usage. A notification will thereby be generated and sent to the user if the actual usage falls into a different usage classification than what was originally planned for, enabling the user to take a decision on how to proceed.

Optionally, the set of battery usage classifications comprises at least three different classifications. These may for example include light, medium and harsh usages.

Optionally, the predetermined notification criterion is considered fulfilled if the predicted actual service life deviates from the predicted expected service life by at least a predetermined amount. Such a notification criterion may be set up and used independently of battery usage classifications, but it may also be used in combination with such classifications.

Optionally, the method further comprises:

if the predetermined notification criterion is fulfilled, determining a reason for the deviation in the predicted actual service life from the predicted expected service life based on at least the obtained operational data.

Such information relating to the reason for the deviation may be important for the user to take an informed decision on a suitable course of action.

Optionally, the method further comprises:

providing information to the user of the battery unit relating to the predicted actual service life of the battery unit.

The information may contain for example a reason for a predicted deviation, a size of the deviation, and/or the predicted remaining service life.

According to a second aspect of the present invention, there is provided a computer program comprising program code means for performing the method of any one of the embodiments of the first aspect when said computer program is run on a computer. Effects and features of the second aspect of the invention are largely analogous to those described above in connection with the first aspect.

According to a third aspect of the present invention, there is provided a computer-readable medium carrying a computer program comprising program means for performing the method of any of the embodiments of the first aspect when said program means is run on a computer. Effects and features of the third aspect of the invention are largely analogous to those described above in connection with the first aspect.

According to a fourth aspect of the present invention, there is provided a control unit configured to perform the method according to any one of the embodiments of the first aspect. Effects and features of the fourth aspect of the invention are largely analogous to those described above in connection with the first aspect.

According to a fifth aspect of the present invention, there is provided a battery management system for an energy storage system comprising the control unit according to the fourth aspect. Effects and features of the fifth aspect of the invention are largely analogous to those described above in connection with the first aspect.

According to a sixth aspect of the present invention, there is provided a vehicle, such as a hybrid vehicle or a fully electrified vehicle, comprising an energy storage system and a control unit according to the fourth aspect. Effects and features of the sixth aspect of the invention are largely analogous to those described above in connection with the first aspect.

The vehicle may be an electrical, hybrid, or plug-in hybrid vehicle comprising an electrical motor, wherein the energy storage system provides power to the electrical motor for providing propulsion for the vehicle. It is to be noted that the vehicle can therefore be either a partly or fully electrical vehicle.

Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, various embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles.

Figure 1:
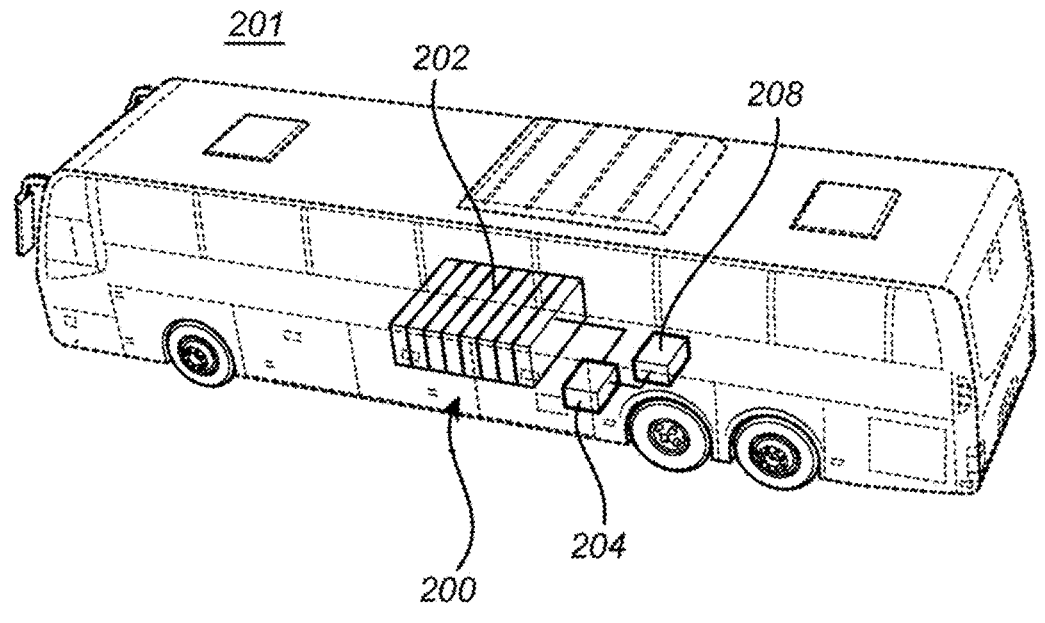
FIG. 1 shows a vehicle in which a method according to the invention may be implemented.

FIG. 1 shows a simplified perspective view of an all-electric vehicle in the form of a bus 201, which according to an embodiment is equipped with at least one electric machine (not shown) for operating the bus. The bus 201 carries an electric energy storage system (ESS) 200 comprising a battery unit 202 in the form of a battery pack, the battery pack comprising a plurality of battery cells (not shown). The battery cells are connected in series to provide an output direct current (DC) voltage having a desired voltage level. Suitably, the battery cells are of lithium-ion type, but other types may also be used. The number of battery cells per battery pack may be in the range of 50 to 500 cells. It is to be noted that the ESS 200 may include a plurality of battery packs. The at least one electric machine forms a load, which when connected to the ESS 200 uses electric current provided from the battery pack 202. An on-board charger (not shown) also forms a load, which may be connected to an external power source and charge the battery pack 202 with electric energy.

A sensor unit (not shown) may be arranged for collecting operational data, i.e. measurement data relating to operating conditions of the ESS 200 or of individual battery packs 202. The sensor unit may be configured for measuring for example temperature, voltage and current level of the associated battery pack 202. Measurement data from each sensor unit is transmitted to an associated battery management unit (BMU) 204, which is configured for managing the individual battery pack 202 during operation of the bus 201. The BMU 204 can also be configured for determining parameters indicating and controlling the condition or capacity of the battery pack 202, such as the state of charge (SOC), the state of health (SOH), the state of power (SOP) and the state of energy (SOE) of the battery pack 202.

The BMU 204 is connected to and configured to communicate with an ESS control unit 208, which controls the ESS 200. The ESS control unit 208 may include a microprocessor, a microcontroller, a programmable digital signal processor or another programmable device. Thus, the ESS control unit 208 comprises electronic circuits and connections (not shown) as well as processing circuitry (not shown) such that the ESS control unit 208 can communicate with different parts of the bus 201 or with different control units of the bus 201. The ESS control unit 208 may comprise modules in either hardware or software, or partially in hardware or software, and communicate using known transmission buses such as a CAN-bus and/or wireless communication capabilities. The processing circuitry may be a general-purpose processor or a specific processor. The ESS control unit 208 comprises a non-transitory memory for storing computer program code and data. Thus, the skilled person realizes that the ESS control unit 208 may be embodied by many different constructions. This is also applicable to the BMU 204.

Figure 2:
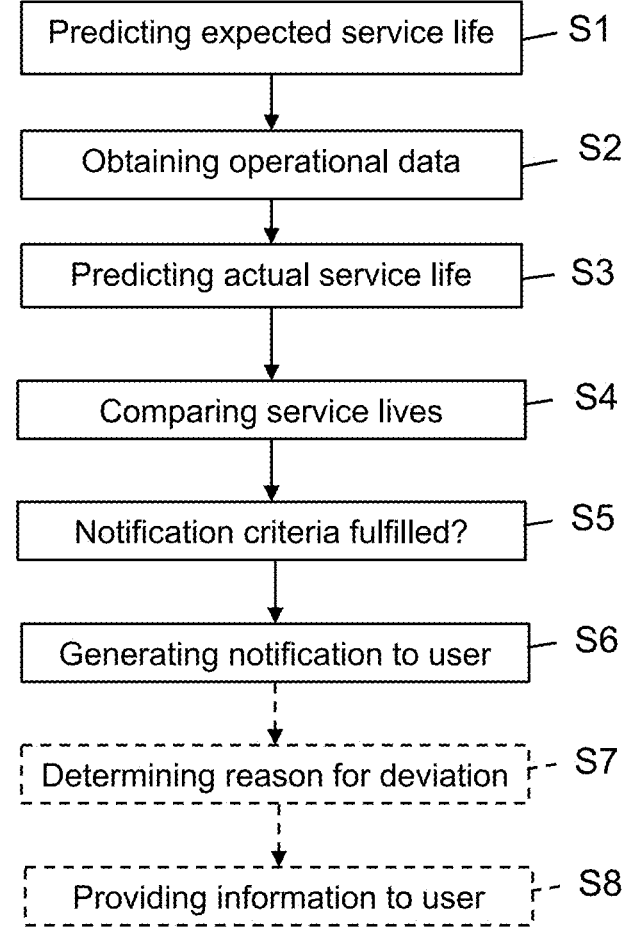
FIG. 2 is a flow-chart illustrating a method according to an embodiment of the invention.

A method for monitoring battery ageing of a battery unit in an energy storage system of a vehicle, such as of the battery pack 202 in the ESS 200 of the bus 201 illustrated in FIG. 1, is schematically illustrated in the flow chart of FIG. 2, in which optional steps are marked with dashed lines.

In a first step S1, an expected service life of the battery unit (battery pack) 202 is predicted based on at least information relating to a planned usage of the battery unit 202. The information relating to the planned usage may be provided by a user of the vehicle 201. For example, the user may provide information that makes it possible to predict expected temperature ranges and charging and discharging cycles of the battery unit 202. The expected service life may be predicted based on simulations as will be further described below.

In a second step S2, carried out during usage of the battery unit 202 within the ESS 200 of the vehicle 201, operational data relating to an actual usage of the battery unit 202 are obtained. This may be realized by collecting measurement data obtained from various sensors and measurement devices of the ESS 200, and also by calculating operational data based on such data. The operational data may for example include measurement data relating to temperature, such as battery temperature and ambient temperature. It may also include operational data relating to depth of discharge (DoD), state of charge (SoC), charging rate, and charging pattern of the battery unit 202.

In a third step S3, an actual service life of the battery unit 202 is predicted based on at least the obtained operational data. The actual service life is herein defined as the time between the beginning of the service life BOL and the end of the service life EOL1 in the first application of the battery unit 202, as illustrated by ageing curves 1, 2, 3 in FIG. 4.

In a fourth step S4, the predicted actual service life is compared with the predicted expected service life, thus obtaining a comparison result.

In a fifth step S5, it is determined whether a predetermined notification criterion is fulfilled based on the comparison result obtained in the fourth step.

In a sixth step S6, a notification to a user of the battery unit 202 is generated if the predetermined notification criterion is fulfilled. The predetermined notification criterion may for example be considered fulfilled if the predicted actual service life deviates from the predicted expected service life by at least a predetermined amount. Other predetermined notification criteria may additionally or alternatively be used. It is possible to use more than one such criteria, for example leading to different notifications being generated.

In an optional seventh step S7, which may be carried out if the predetermined notification criterion is fulfilled, a reason for the deviation in the predicted actual service life from the predicted expected service life is determined based on at least the obtained operational data.

In a further optional step S8, information is provided to the user of the battery unit 202, the information relating to the predicted actual service life of the battery unit 202.

Figure 3:
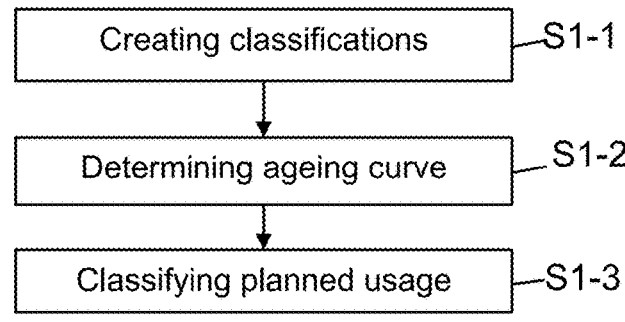
FIG. 3 is another flow-chart illustrating steps of a method according to an embodiment of the invention.

The prediction of the expected service life of the battery unit 202, carried out in the first step S1, may for example be realized using a series of substeps schematically illustrated in FIG. 3:

S1-1) Creating a set of battery usage classifications, wherein each battery usage classification is associated with at least one set of predefined operating parameter ranges. Such usage classifications may include e.g. light, medium and harsh usages, each being associated with predefined operating parameter ranges in terms of e.g. temperature, depth of discharge (DoD), state of charge (SoC), charging rate, and/or charging pattern of the battery unit 202.

Figure 4:
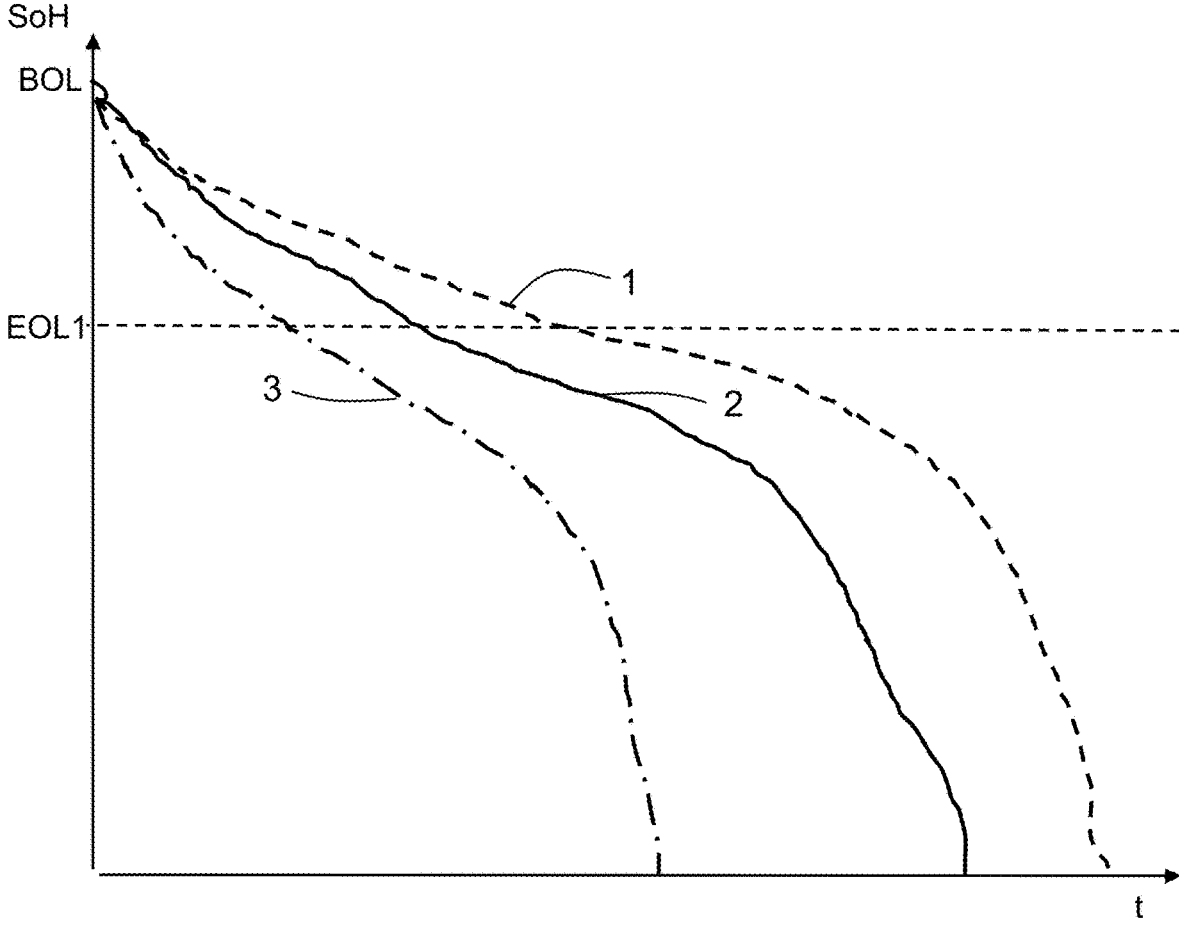
FIG. 4 is a diagram showing ageing curves of a battery unit.

S1-2) For each battery usage classification, determining at least one expected ageing curve associated with each battery usage classification. Exemplary ageing curves 1, 2, 3 are illustrated in FIG. 4, corresponding to light usage 1, medium usage 2, and harsh usage 3, respectively. The ageing curves describe State of Health, SoH, as a function of time t, wherein end of the service life in the first application, EOL1, is a predefined level of SoH at which the battery unit 202 does no longer meet predefined criteria for its present application within the ESS 200. For example, this may be at a SoH level of 80%. If the user acquires an ESS with a capacity of 100 kWh and intends to use it for eight years with a usage corresponding to a medium usage 2, the battery capacity of the ESS should in this case be 80 kWh after this time period.

As can be seen from the curves, light usage 1 leads to the longest expected service life, whereas harsh usage 3 leads to the shortest expected service life. The expected ageing curves may be determined by simulating ageing of the battery unit 202 for operating parameter values within the predefined operating parameter ranges corresponding to the different classifications. The simulation of ageing may advantageously be performed based on battery cell operational data obtained in laboratory battery cell tests, wherein the battery cell tests are carried out for at least one type of battery cell comprised in the battery unit 202.

S1-3) Classifying the planned usage of the battery unit 202, i.e. the operating parameter values which are expected to be used in the application of the battery unit 202 within the vehicle 201, in accordance with the set of battery usage classifications. The prediction of the expected service life may now be determined based on the expected ageing curve of the battery usage classification associated with the classified planned usage, such as the curves corresponding to light usage 1, medium usage 2, and harsh usage 3.

The step S3 of predicting the actual service life of the battery unit 202 may comprise classifying the actual usage of the battery unit 202 in accordance with the set of battery usage classifications. This may be carried out continuously, or at regular intervals, or at predetermined occasions, during use of the ESS 200 and the battery unit 202. Furthermore, the predicted actual service life of the battery unit 202 may be determined based on the expected ageing curve 1, 2 or 3 of the battery usage classification associated with the classified actual usage. In the example given above, in which the user acquires an ESS with a capacity of 100 kWh and intends to use it according to a medium usage 2, the actual use of the ESS may be such as to cause faster ageing of the ESS. The actual usage may for example be classified as a harsh usage 3, which will lead to reaching the battery capacity of 80 kWh, corresponding to the end of life EOL1, after six years instead of after eight years.

In this embodiment, the predetermined notification criterion used in the fifth step S5 may be considered fulfilled if the battery usage classification associated with the classified actual usage differs from the battery usage classification associated with the classified planned usage, since this will lead to a deviation in expected service life of the battery unit 202.

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data that cause a general-purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims. For example, although the present invention has mainly been described in relation to an electrical bus, the invention should be understood to be equally applicable for any type of electric vehicle, in particular an electric truck or the like.

The invention claimed is:

1. A method for monitoring battery ageing of a battery unit in an energy storage system of a vehicle or a vessel, the method comprising:

predicting an expected service life of the battery unit based on at least information relating to a planned usage of the battery unit, wherein predicting the expected service life of the battery unit comprises:

creating a set of battery usage classifications, wherein each battery usage classification is associated with at least one set of predefined operating parameter ranges, for each battery usage classification, determining at least one expected ageing curve associated with each battery usage classification, classifying the planned usage of the battery unit in accordance with the set of battery usage classifications, wherein the prediction of the expected service life is determined based on the at least one expected ageing curve of the battery usage classification associated with the classified planned usage, during usage of the battery unit, obtaining operational data relating to an actual usage of the battery unit, predicting an actual service life of the battery unit based on at least the obtained operational data, wherein predicting the actual service life of the battery unit comprises classifying the actual usage of the battery unit in accordance with the set of battery usage classifications, the predicted actual service life of the battery unit being determined based on the at least one expected ageing curve of the battery usage classification associated with the classified actual usage, comparing the predicted actual service life with the predicted expected service life, thus obtaining a comparison result;

determining whether a predetermined notification criterion is fulfilled based on the comparison result, generating a notification to a user of the battery unit if the predetermined notification criterion is fulfilled.

2. The method according to claim 1, wherein determining the at least one expected ageing curve comprises simulating ageing of the battery unit for operating parameter values within the at least one set of predefined operating parameter ranges.

3. The method according to claim 2, wherein the simulation of ageing is performed based on battery cell operational data obtained in battery cell tests, wherein the battery cell tests are carried out for at least one type of battery cell comprised in the battery unit.

4. The method according to claim 2, wherein the set of battery usage classifications comprises at least three different classifications.

5. The method according to claim 1, wherein the predetermined notification criterion is considered fulfilled if the battery usage classification associated with the classified actual usage differs from the battery usage classification associated with the classified planned usage.

6. The method according to claim 1, wherein the predetermined notification criterion is considered fulfilled if the predicted actual service life deviates from the predicted expected service life by at least a predetermined amount.

7. The method according to claim 6, further comprising:

if the predetermined notification criterion is fulfilled, determining a reason for the deviation in the predicted actual service life from the predicted expected service life based on at least the obtained operational data.

8. The method according to claim 1, further comprising:

providing information to the user of the battery unit relating to the predicted actual service life of the battery unit.

9. A non-transitory computer readable medium carrying a computer program comprising program code for performing the method according to claim 1 when said program code is run on a computer.

10. A control unit configured to perform the method according to claim 1.

11. A battery management system for an energy storage system comprising the control unit according to claim 10.

12. A hybrid vehicle, comprising an energy storage system and a control unit according to claim 10.

13. A fully electrified vehicle, comprising an energy storage system and a control unit according to claim 10.

* * * * *